United States Patent
Goldan et al.

(10) Patent No.: US 10,658,530 B2
(45) Date of Patent: May 19, 2020

(54) MULTI-WELL SELENIUM DEVICE AND METHOD FOR FABRICATION THEREOF

(71) Applicant: The Research Foundation for The State University of New York, Albany, NY (US)

(72) Inventors: Amirhossein Goldan, Stony Brook, NY (US); Wei Zhao, East Setauket, NY (US)

(73) Assignee: The Research Foundation for The State University of New York, Albany, NY (US)

( * ) Notice: Subject to any disclaimer, the term of this patent is extended or adjusted under 35 U.S.C. 154(b) by 21 days.

(21) Appl. No.: 16/068,563

(22) PCT Filed: Jan. 9, 2017

(86) PCT No.: PCT/US2017/012712
§ 371 (c)(1),
(2) Date: Jul. 6, 2018

(87) PCT Pub. No.: WO2017/120582
PCT Pub. Date: Jul. 13, 2017

(65) Prior Publication Data
US 2019/0006533 A1 Jan. 3, 2019

Related U.S. Application Data

(60) Provisional application No. 62/275,919, filed on Jan. 7, 2016.

(51) Int. Cl.
*H01L 31/0272* (2006.01)
*H01L 31/107* (2006.01)
(Continued)

(52) U.S. Cl.
CPC ...... *H01L 31/0272* (2013.01); *H01L 27/1461* (2013.01); *H01L 27/1463* (2013.01);
(Continued)

(58) Field of Classification Search
CPC .......... H01L 27/1463; H01L 27/14643; H01L 27/14659; H01L 31/02024; H01L 31/0272; H01L 31/08; H01L 31/31095
See application file for complete search history.

(56) References Cited

U.S. PATENT DOCUMENTS 7,256,402 B1  8/2007  Lee
7,301,135 B2  11/2007  Shoji

FOREIGN PATENT DOCUMENTS

KR   1020100001639   1/2010
WO   WO 2014/015285   1/2014
WO   WO 2014/194071   12/2014

OTHER PUBLICATIONS

PCT/ISA/210 Search Report issued on PCT/US2017/012712 pp. 3.
(Continued)

*Primary Examiner* — Hoai V Pham
(74) *Attorney, Agent, or Firm* — The Farrell Law Firm, P.C.; John F. Gallagher, III

(57) ABSTRACT

Provided is a field shaping multi-well detector and method of fabrication thereof. The detector is configured by depositing a pixel electrode on a substrate, depositing a first dielectric layer, depositing a first conductive grid electrode layer on the first dielectric layer, depositing a second dielectric layer on the first conductive grid electrode layer, depositing a second conductive grid electrode layer on the second dielectric layer, depositing a third dielectric layer on the second conductive grid electrode layer, depositing an etch mask on the third dielectric layer. Two pillars are formed by etching the third dielectric layer, the second conductive grid electrode layer, the second dielectric layer, the first conduc-
(Continued)

tive grid electrode layer, and the first dielectric layer. A well between the two pillars is formed by etching to the pixel electrode, without etching the pixel electrode, and the well is filled with a-Se.

9 Claims, 6 Drawing Sheets

(51) Int. Cl.
    *H01L 27/146*     (2006.01)
    *H01L 31/0352*     (2006.01)
    *H01L 31/0216*     (2014.01)
    *H01L 31/0224*     (2006.01)
    *H01L 31/0376*     (2006.01)
    *H01L 31/105*     (2006.01)

(52) U.S. Cl.
    CPC .. *H01L 27/14636* (2013.01); *H01L 27/14643* (2013.01); *H01L 27/14659* (2013.01); *H01L 27/14696* (2013.01); *H01L 31/02161* (2013.01); *H01L 31/022408* (2013.01); *H01L 31/0376* (2013.01); *H01L 31/035209* (2013.01); *H01L 31/105* (2013.01); *H01L 31/107* (2013.01); *H01L 27/14612* (2013.01); *H01L 27/14632* (2013.01); *H01L 27/14692* (2013.01)

(56) References Cited

OTHER PUBLICATIONS

PCT/ISA/237 Written Opinion issued on PCT/US2017/012712 pp. 8.

Goldan, A. H. et al., Unipolar Time-Differential Pulse Response with a Solid-State Charpak Photoconductor, Applied Physics Letters, Nov. 2012 . . . vol. 101, Issue 21, See pp. 2-9; and figure 2, pp. 14.

James R. Scheuermann et al., "Low Dose Digital X-Ray Imaging with Avalanche Amorphus Selenium", Progress in Biomedical Optics and Imaging, SPIE—International Society for Optical Engineering, XP060050966, vol. 9412, Mar. 18, 2015, pp. 9.

Denny L.Y. Lee et al., New Developments in full-field Radiography Detectors: Direct Conversion Selenium Detector with avalanche Gain Layer, Proceedings of SPIE, 2009 International Conference on Optical Instruments and Technology, XP055601255, vol. 5541, Oct. 26, 2004, pp. 8.

European Search Report dated Jul. 11, 2019 issued in counterpart application No. 17736511.1-1212, 12 pages.

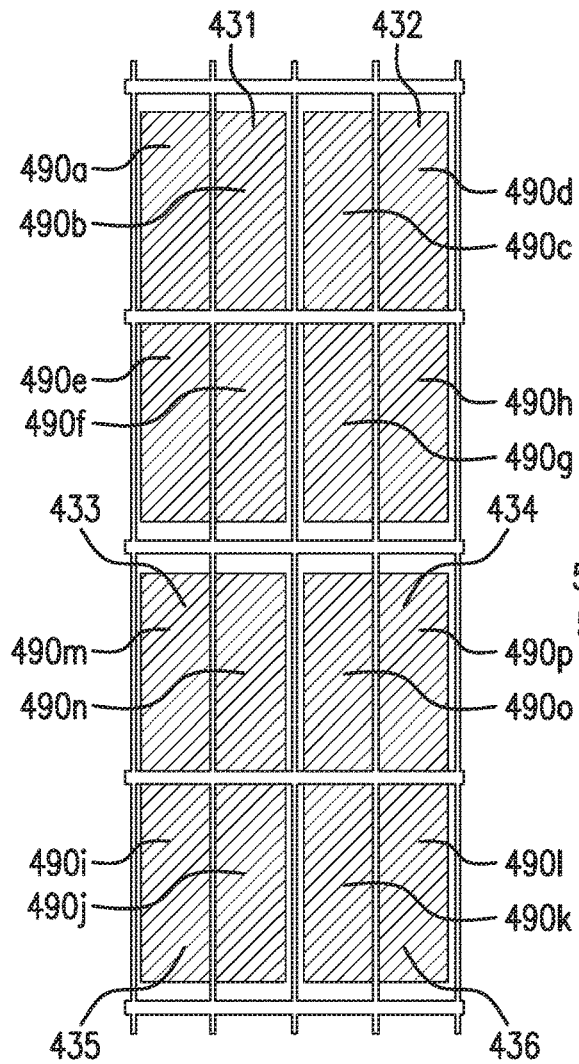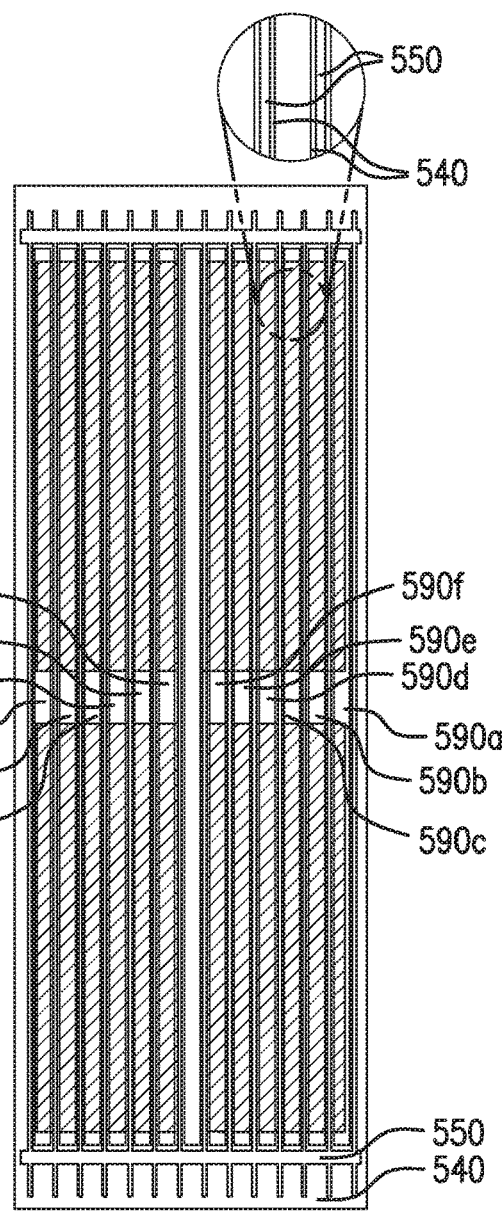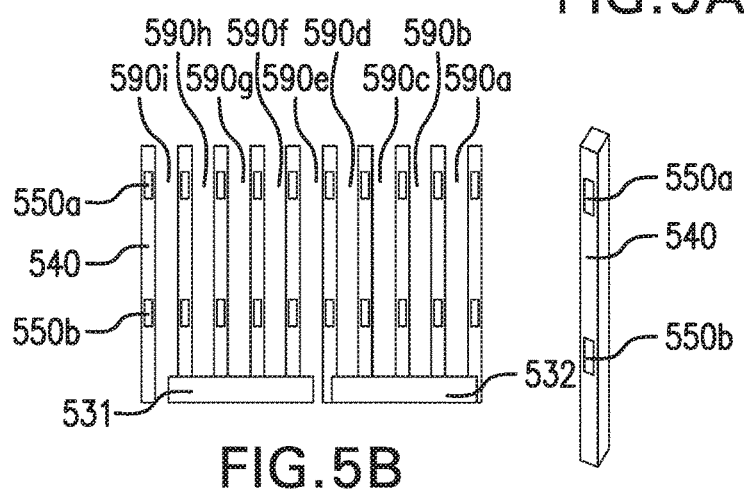

MULTI-WELL SELENIUM DEVICE AND METHOD FOR FABRICATION THEREOF

PRIORITY

This application claims priority to U.S. Provisional Patent Application No. 62/275,919 filed with the U.S. Patent and Trademark Office on Jan. 7, 2016, the entire contents of which is incorporated herein by reference.

GOVERNMENT SUPPORT

This invention was made with government support under grant number 1R21 EB01952601A 1 awarded by the National Institute of Health. The government has certain rights in the invention.

BACKGROUND OF THE INVENTION

1. Field of the Invention

The present invention relates generally to the field of solid-state radiation imaging detectors and, in particular, to amorphous selenium radiation detectors having a field-shaping multi-well detector structure.

2. Description of the Related Art

Soon after the Nobel Prize winning invention of the gas-filled multi-wire proportional chamber by Charpak in 1968, and parallel to developments in microelectronics, micro-pattern gaseous detectors were developed for improved position resolution. However, the range of radiation induced photoelectrons is micrometer-to-millimeter, with gas solid-state detectors having three orders of magnitude shorter photoelectron range due to their much higher density. Thus, solid-state detectors yield images with substantially higher spatial/temporal resolution. Disordered solids, which are easier and less expensive to develop than single crystalline solids, have not been utilized as photon-counting mode detection media because of low carrier mobility and transit-time-limited photo response.

Amorphous selenium (a-Se), which was previously developed for photocopying machines, has been commercially revived as a direct x-ray photoconductor for flat-panel detectors (FPD) because a-Se has a high x-ray sensitivity and can be uniformly evaporated over large area as a thick film.

A non-ohmic effect in disordered solids may occur in the presence of a strong field with the transport mechanism shifted from localized states into extended states where the mobility can be increased by 100 to 1000 times. Such hot carriers in extended states with mobilities near a mobility edge can gain energy faster than they lose energy to phonons. Thus, avalanche due to impact ionization is possible [2], e.g., hot holes in a-Se [3-5], in contrast to hot electrons in amorphous silicon [6]. Continuous and stable avalanche multiplication has been shown in a-Se, a feature that enabled the development of an optical camera with higher sensitivity than the human eye, i.e., 11× at aperture F8, or 100 times more sensitive than a CCD camera) [7]. For high-energy penetrating radiation, the challenge is that avalanche-mode selenium cannot be the bulk medium because avalanche layers cannot be very thick (<25 μm) and a uniform avalanche field in the bulk causes depth-dependent gain variations.

Positron emission tomography (PET) is a nuclear medical imaging modality that produces three-dimensional (3D) images to see functional processes in human body. PET is most commonly used in clinical oncology for detecting cancer and for clinical diagnosis of heart problems and/or brain disorders. After being introduced into the body, positron-emitting radionuclides decay with each annihilation, emitting two photons in diametrically opposing directions. Time of flight (TOF) measurements may be utilized to measure the time for the electromagnetic wave to travel a distance through a medium. A TOF PET system detects the photons, and uses TOF information to determine if two registered photons are in time coincidence, i.e., belong to a same positron annihilation event. The TOF PET system uses the arrival time difference to localize each annihilation event. Without the TOF localization data, computationally expensive iterative reconstruction algorithms are used to estimate the 3D distribution of events that provide the best match with the measured projection data.

Localization accuracy $\Delta x$ of a TOF PET system is determined by time-resolution $\Delta t$ of the radiation detector according to Equation (1):

$$\Delta x = c\Delta t/2, \quad (1)$$

where c is the speed of light. A goal of a TOF PET detector is $\Delta t < 10$ picoseconds (ps). However, this goals has not been realized.

Existing systems utilize expensive photomultiplier tubes (PMTs) that are based on the complicated plano-concave photocathode, yet can only achieve $\Delta t$ of ~500 ps. Silicon photomultipliers (SiPMs), which are based on Geiger mode operating avalanche photodiodes, are rapidly developing. SiPMs have achieved $\Delta t$ better than PMTs, i.e., with SiPM achieving a $\Delta t$ of ~100 ps. However, SiPMs suffer from poor photon detection efficiency, optical crosstalk, small area, poor uniformity, and high cost.

A direct conversion a-Se FPD with separate absorption and avalanche gain regions has been proposed [8,9] and theoretical imaging performance has been analyzed [4]. It has been shown that a separate localized avalanche multiplication region minimizes gain variation compared to bulk avalanche, i.e., avalanche in entire volume of a-Se [10]. However, such direct conversion a-Se FPD has not been realized due to formation of field hot-spots, where the applied electric field (F) exceeds 150 V/μm, which lead to irreversible material breakdown.

Limitations of direct conversion a-Se FPDs include degradation of low-dose imaging performance due to electronic noise since the energy required to generate an electron-hole pair in a-Se is 50 eV at 10 V/micron. Although other photoconductive materials with higher conversion have been investigated, direct conversion a-Se FPDs remain far from commercialization due to charge trapping and manufacturing issues. Improved conversion of a-Se is possible by increasing the electric field above 30 V/micron, i.e., 30,000 V on a 1000 micron layer. However, this electric field increase is extremely challenging for reliable detector construction and operation, and is impractical.

Amorphous solids, i.e., non-crystalline solids with disorder, have been ruled out as viable radiation imaging detectors in a photon-counting mode because of low temporal resolution due to low carrier mobilities and transit-time limited pulse response, and low conversion gain of high energy radiation to electric charge. A direct conversion a-Se layer with separate absorption and avalanche region has been suggested, but significant obstacles prevent practical implementation of a direct conversion a-Se layer with separate absorption and avalanche regions.

Unipolar solid-state detectors with a Frisch grid have been proposed. [11-13] However, such detector structures are not practical for direct conversion avalanche gain because the highest electric field in the well develops at the interface between the semiconductor and the pixel electrode, resulting in a high dark current due to large charge injection and potentially irreversible damage to the detector.

A unipolar time-differential (UTD) solid-state detector has been fabricated using a high granularity micropattern multi-well structure, i.e., a multi-well solid-state detector (MWSD), as shown in FIG. 1, which is a cross-section of a MWSD obtained by a scanning electron microscope (SEM) [12]. As shown in FIG. 1, a common electrode 110 is provided at an upper portion thereof and a substrate 160 is provided at an opposite lower portion. A pixel electrode 130 is formed on an upper surface of the substrate 160 as a collector, and a plurality of insulators are formed on an upper surface of the pixel electrode 130, with a shield 120 formed on top of each insulator 150 of the plurality of insulator. A plurality of wells 140, 142 are provided between respective insulators of the plurality of insulator.

Time-of-flight experimental results show substantial improvement in the detector's time resolution due to UTD charge sensing. Also, an ultimate physical limit in signal risetime, as set by the spreading of the photo-induced carrier packet, was achieved. [12,13,15-17] However, conventional systems do not etch dielectric at the bottom of wells, nor are grid electrodes encapsulated with dielectric layers provide on each side thereof.

Other amorphous selenium multi-well avalanche detectors fabrication methods have been proposed for nano-electrode multi-well high-gain avalanche rushing photoconductor and a field-shaping multi-well avalanche detector. [15, 16] However, these methods require alignment, i.e., alignment during lithography, for encapsulating the grid electrodes with insulator/dielectric while removing the insulator/dielectric at the bottom of the wells.

SUMMARY OF THE INVENTION

To overcome shortcomings of conventional systems, a multi-well selenium detector provided herein and a method for the fabrication of same that eliminates the required alignment and encapsulates grid electrodes with the insulator/dielectric.

Accordingly, aspects of the present invention address the above problems and disadvantages and provide the advantages described below. An aspect of the present invention provides practical detector structures without field hot-spots to realize direct conversion avalanche a-Se.

An aspect of the present disclosure provides a method of fabricating a multi-well amorphous selenium (a-Se) detector, comprising depositing a pixel electrode on a substrate; depositing a first dielectric layer; depositing a first conductive grid electrode layer on the first dielectric layer; depositing a second dielectric layer on the first conductive grid electrode layer; depositing a second conductive grid electrode layer on the second dielectric layer; depositing a third dielectric layer on the second conductive grid electrode layer; depositing an etch mask on the third dielectric layer; performing a first etching to form at least two pillars with at least one well therebetween; depositing an oxide dielectric layer on the at least two pillars and on a bottom of the at least one well; and performing a second etching to remove the oxide dielectric layer from the bottom of the at least one well.

Another aspect of the present disclosure provides a nano-pattern, multi-well, solid-state a-Se radiation detector comprising a semiconductor, a pixel electrode, a first dielectric layer, a second dielectric layer, a third dielectric layer, a first conductive grid electrode layer, and a second conductive grid electrode layer. The pixel electrode is deposited on the substrate, the first conductive grid electrode layer is deposited on the first dielectric layer, the second dielectric layer is deposited on the first conductive grid electrode layer, the second conductive grid electrode layer is deposited on the second dielectric layer, the third dielectric layer is deposited on the second conductive grid electrode layer, an etch mask is deposited on the third dielectric layer, a first etching forms at least two pillars with at least one well therebetween, an oxide dielectric layer is deposited on the at least two pillars and on a bottom of the at least one well, and a second etching removes the oxide dielectric layer from the bottom of the at least one well.

BRIEF DESCRIPTION OF THE DRAWINGS

The above and other aspects, features and advantages of certain embodiments of the present invention will be more apparent from the following detailed description taken in conjunction with the accompanying drawings, in which:

FIG. 4 is a top view of a conventional device;

FIG. 5(a) is a top view of a linear array of micro-strip grid electrodes over a multi-pixel substrate according to an embodiment of the present disclosure;

FIG. 5(b) is a profile view of the assembled pillar array of FIG. 5(a);

DETAILED DESCRIPTION OF EMBODIMENTS OF THE INVENTION

The following detailed description of certain embodiments of the present invention will be made with reference to the accompanying drawings. In describing the invention, explanation about related functions or constructions known in the art are omitted for the sake of clearness in understanding the concept of the invention, to avoid obscuring the invention with unnecessary detail.

Disclosed herein is a solid-state avalanche radiation detector, and a method for constructing same, using amorphous material as the photoconductive layer without field hot-spots, to provide a direct conversion avalanche a-Se.

The solid-state avalanche radiation detector is based on field-shaping by localizing the high-field avalanche region between two low-field regions, improving on the devices of Sauli, Lee, and Goldan. [9, 11, 14-16]

The present disclosure optimizes the solid-state detector structure to provide stable avalanche multiplication gain in direct conversion amorphous selenium radiation detectors. The detector structure is referred to as a field-shaping multi-well avalanche detector (SWAD) that provides a practical manner to achieve stable avalanche in large area direct radiation detectors, by varying thickness of a low-field interaction region to stop high-energy radiation and optimizing the high-field multi-well detection region for avalanche multiplication.

Stable avalanche multiplication gain is achieved by eliminating field hot-spots using high-density avalanche wells with insulated walls, with field-shaping within each well.

The high-density insulated wells and field-shaping eliminates formation of field hot-spots in the avalanche region and eliminates high fields at the metal-semiconductor interface. The electric field at the metal-semiconductor interface is one order-of-magnitude lower than a peak value where avalanche occurs. The field-shaping electrodes, high-density insulated wells and field-shaping provide a semi-Gaussian field distribution inside each well.

FIGS. 2(a)-2(l) illustrate a method to fabricate a multi-well substrate with encapsulated pillars according to an embodiment of the present disclosure. FIGS. 2(a)-2(l) illustrate relevant sequential steps in the fabrication. For conciseness, FIGS. 2(a)-2(l) illustrate only two grid layers, repetition of which allows for depositing of more than two insulating dielectric layers and conductive grid electrodes.

Figure 1:
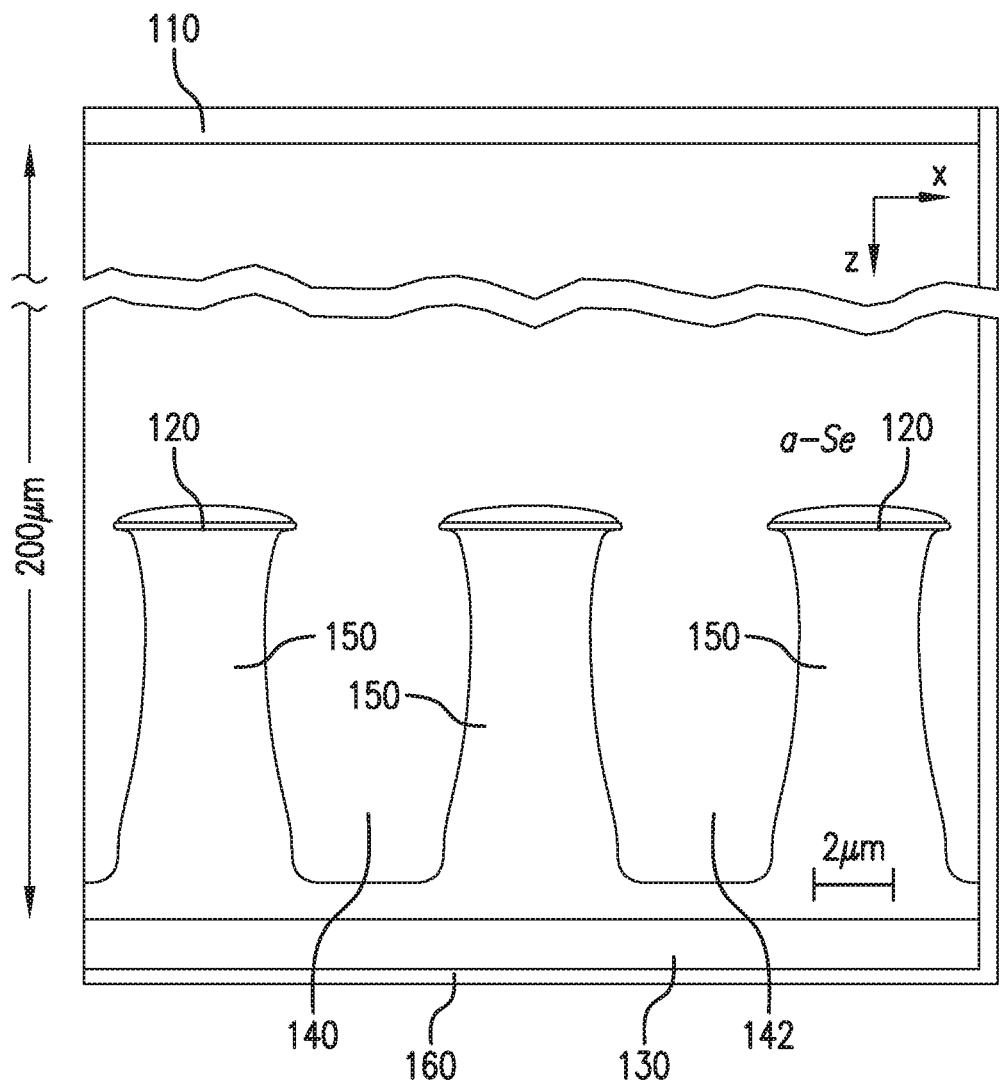
FIG. 1 is an SEM cross-section of a conventional micro well solid-state detector.
Figure 2A:
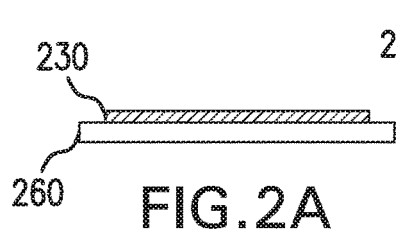
FIGS. 2(a)-2(l) illustrate a method to fabricate a multi-well substrate with encapsulated pillars according to an embodiment of the present disclosure.

FIG. 2(a) illustrates conductive pixel electrode 230 being patterned on a substrate 260 by photolithography. The substrate 260 is preferably glass, e.g., quartz, soda lime, fused silica, or silicon. Alternatively, a thin-film transistor (TFT) substrate or a complementary metal-oxide semiconductor (CMOS) substrate can be utilized with a previously patterned pixel electrode. The pixel electrode 230 is configured to collect generated electronic charges, and is preferably formed of conductive materials that include Aluminum (Al), Chromium (Cr), Tungsten (W), Indium tin oxide (ITO), and Zinc oxide (ZnO).

Figure 2B:
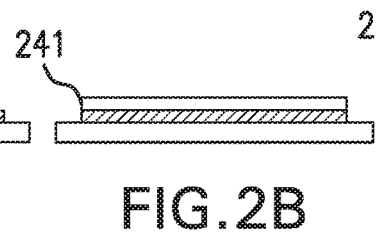

FIG. 2(b) illustrates a first dielectric layer 241, i.e., insulating layer, deposited on the substrate 260. Dielectric materials are poor conductors of electric current, and deposition is preferably performed via one of physical vapor deposition (PVD), spin casting, plasma-enhanced chemical vapor deposition (PECVD), and atomic layer deposition (ALD). The PVD can include thermal evaporation, electron-beam evaporation, or sputtering. The first dielectric layer 241 is formed from non-conductive or very low-conductivity materials, e.g., polyimide (PI), Silicon Oxide (SiO), Silicon Nitride (SiN), and Aluminum Oxide (AlO).

Figure 2C:
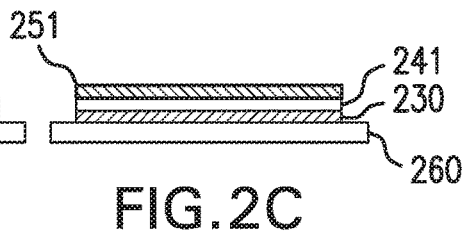
Figure 2D:
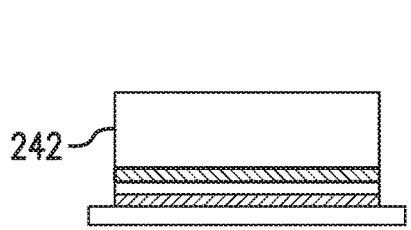
Figure 2E:
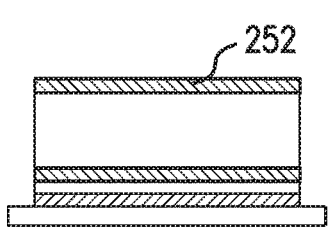
Figure 2F:
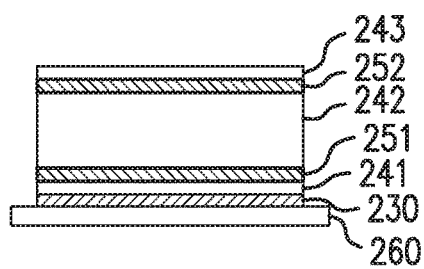

FIG. 2(c) illustrates a first conductive grid electrode layer, i.e., grid-1, deposited on the first dielectric layer 241. FIG. 2(d) illustrates second dielectric layer 242 deposited on first conductive grid electrode layer 251. FIG. 2(e) illustrates a second conductive grid electrode layer 252, i.e., grid-2, deposited on the second dielectric layer 242. FIG. 2(f) illustrates a third dielectric layer 243 deposited on the second conductive grid electrode layer 252.

Figure 2G:
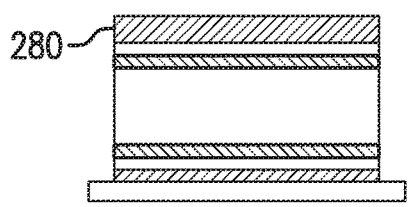
Figure 2H:
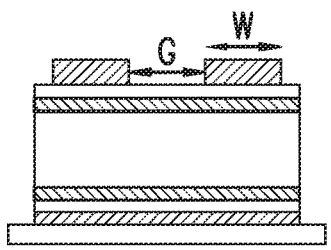

As shown in FIG. 2(g), after depositing the third conductive dielectric layer 243 on the second conductive grid electrode layer 252, a mask layer 280 is deposited on the third dielectric layer 243, as an etch mask. The mask layer 280 is a metal, an organic photoresist or other material having high etch resistivity. FIG. 2(h) illustrates the mask layer 280 being patterned using optical contact photolithography, optical lithography, e.g., stepper lithography, or electron beam lithography (EBL).

Figure 2I:
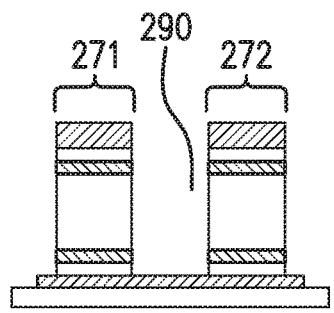

FIG. 2(i) illustrates results of anisotropic etching that preserves patterning. The anisotropic etching continues through the layered dielectrics and grids until the pixel electrode 230 is reached, and does not etch the pixel electrode 230. Dry etching is preferably used for both dielectrics and grid electrodes.

Dry etching may be performed using reactive ion etching (RIE) or deep RIE. Anisotropic etching of organic polymer dielectric is preferably performed with a deep RIE tool using an inductively charged plasma (ICP) etch system at low pressure and low temperature. Anisotropic etching of oxide dielectrics, such as SiO, is preferably performed using fluorinated anisotropic etching where each dry etch sequence is followed by a secondary plasma deposition that furnishes a layer of fluorocarbon polymer passivation on the sidewalls. Other anisotropic etching techniques may be utilized as long as the oxide is only vertically etched at well bottoms without sidewall etching, thereby preserving oxide at the sidewalls during the etch to encapsulate the grid electrodes inside the wells.

Figure 2J:
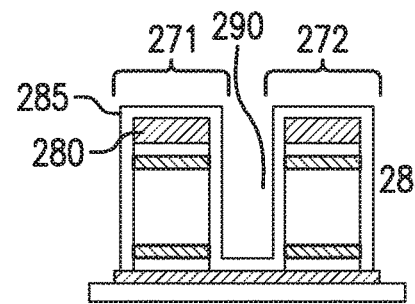

FIG. 2(j) illustrates deposit of a dielectric oxide dielectric layer 285, e.g., SiO, AlO, that conformally encapsulates pillars 271, 272 and well 290. Conformal oxide deposition methods include atomic layer deposition (ALD) and silane-based PECVD. Liquid tetraethoxysilane (TEOS) can be used as a source of Si instead of silane gas (TEOS-PECVD).

Figure 2K:
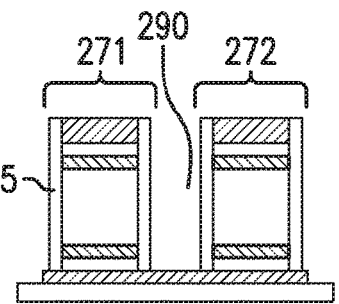

FIG. 2(k) illustrates anisotropic etching of an upper surface of the remaining mask layer 280, and the oxide at the bottom of the well, using dry RIE. The anisotropic etching removes the encapsulation between pillars 271, 272 at the bottom of the well 290. Anisotropic etching of oxide dielectrics, such as SiO, maybe done using fluorinated anisotropic etching where each dry etch sequence is followed by a secondary plasma deposition that furnishes a very thin fluorocarbon polymer passivation on the sidewalls.

Figure 2L:
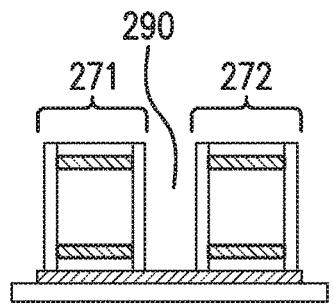

FIG. 2(l) illustrates removal of the etch mask by either dry or wet etching, thereby forming the multi-well substrate having at least two encapsulated grid electrodes, formed on substrate 260. The anisotropic etching yields substantially vertical sidewalls, and forms at least two pillars 271, 272, each of width W (FIG. 2(h)), with gap G therebetween.

Figure 3A:
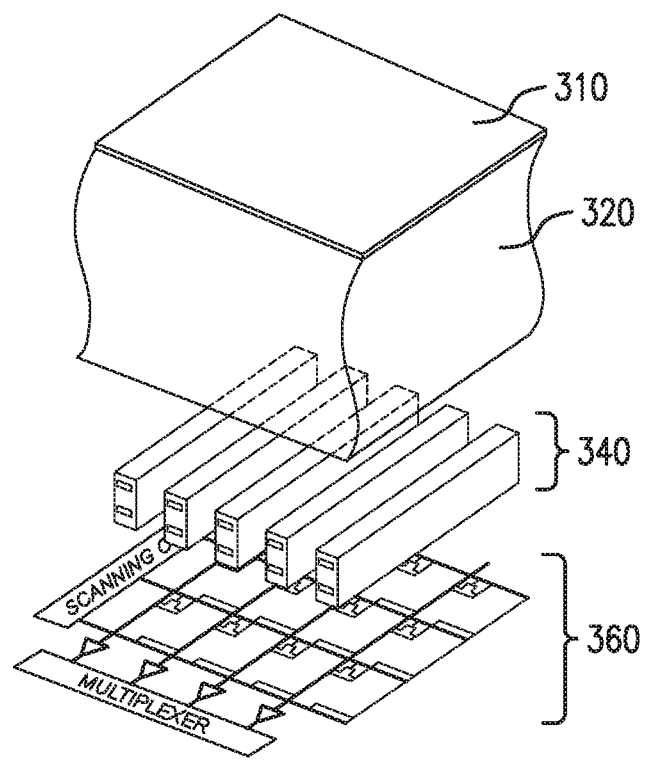
FIG. 3(a) is an exploded view of a pillar array having encapsulated grid electrodes, formed on an array of pixel electrodes according to an embodiment of the present disclosure.

FIG. 3(a) is an exploded view of a pillar array having encapsulated grid electrodes, formed on an array of pixel electrodes according to an embodiment of the present disclosure.

Figure 3B:
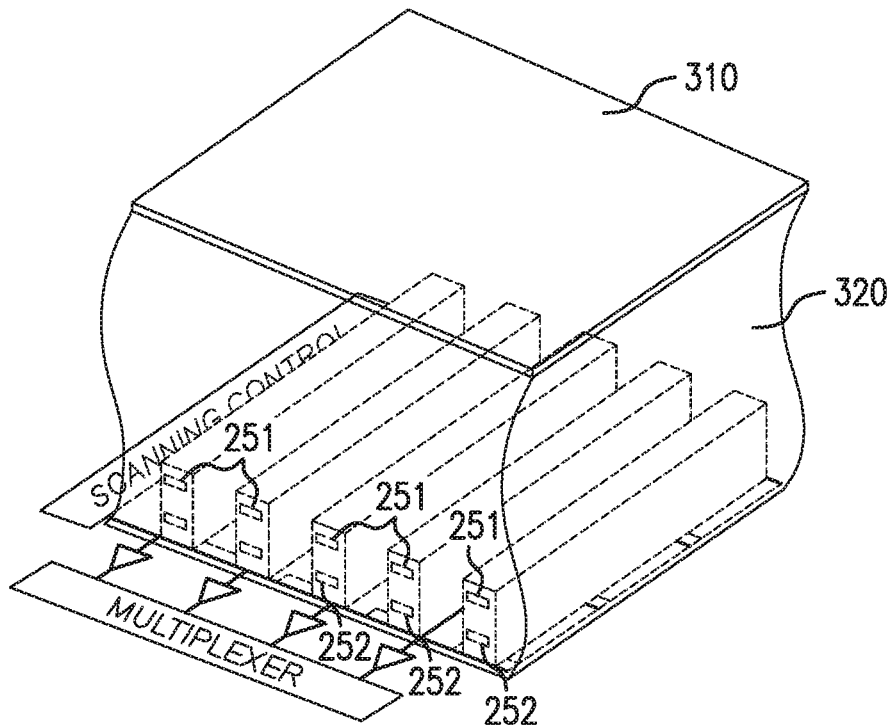
FIG. 3(b) is an assembled view of the pillar array of FIG. 3(a)

FIG. 3(b) is an assembled view of the pillar array of FIG. 3(a). FIG. 3(c) is a profile view of the assembled pillar array of FIG. 3(a).

FIGS. 3(a) to 3(c) illustrate a device configured for scanning control and multiple busses for output from the pixel electrode array to an imager substrate with TFT or CMOS readout electronics, or the like. As shown in FIGS. 3(a) and 3(b), a multi-well structure 340 is formed on top of a substrate 360. An a-Se layer 320 fills wells of the multi-well structure 340, up to a common electrode 310. The a-Se layer 320 is an n-i-p or p-i-n layer with the p- or similar layer as the first layer deposited over the substrate, i.e., the multi-well substrate, followed by the i-layer, then the n- or similar layer, followed by the high voltage electrode. Once the multi-well structure is formed on the substrate, the amorphous selenium photoconductor is deposited over the multi-well substrate. The selenium deposition may include the p-i-n process where a p-like electron-blocking layer is first deposited over the multi-well substrate. The intrinsic stabilized selenium is then evaporated to form a bulk semiconductor layer. An n-like, i.e., n-type, hole-blocking layer is then deposited, and a conductive high-voltage (HV) electrode is then deposited. For optical light detection, the conductive HV electrode is transparent or semi-transparent. For example, ITO or ZnO are conductive layers that can also be optimized for high light transparency.

As shown in FIGS. 2(k), 2(l), 3(a), and 3(b) the oxide at the bottom of each of the wells is etched away.

FIG. 4 is a top view of a conventional device. As shown in FIG. 4, in conventional devices, each well 490a-490p corresponds to no more than one pixel 431-426, each well is square in shape, each well is surrounded by the pixel boundary in both X and Y dimensions, and wells must be aligned to a central axis of the pixel electrode.

FIG. 5(a) is a top view of a linear array of micro-strip grid electrodes over a multi-pixel substrate according to an embodiment of the present disclosure. FIG. 5(b) is a profile view of the assembled pillar array of FIG. 5(a). Comparison of FIG. 4 to FIGS. 5(a) and 5(b) shows that the present disclosure allows each well 590a-590i to be shared by many, i.e., at least two, pixel electrodes 531, 532; that each well 590a-590i is not restricted by the shape of the pixel electrode and can extend across pixel boundaries; and that wells 590a-590i are formed from micro-strip grid of electrodes 550 and dielectric 540. As shown in FIG. 5(b), the electrodes include a top grid 550a and a bottom grid 550b. A linear array of micro-strip grid electrodes is provided over a multi-pixel substrate with wells that do not need to be aligned to any pixel electrode, provides overlapping grid electrodes that are self-aligned to each other.

Figure 6:
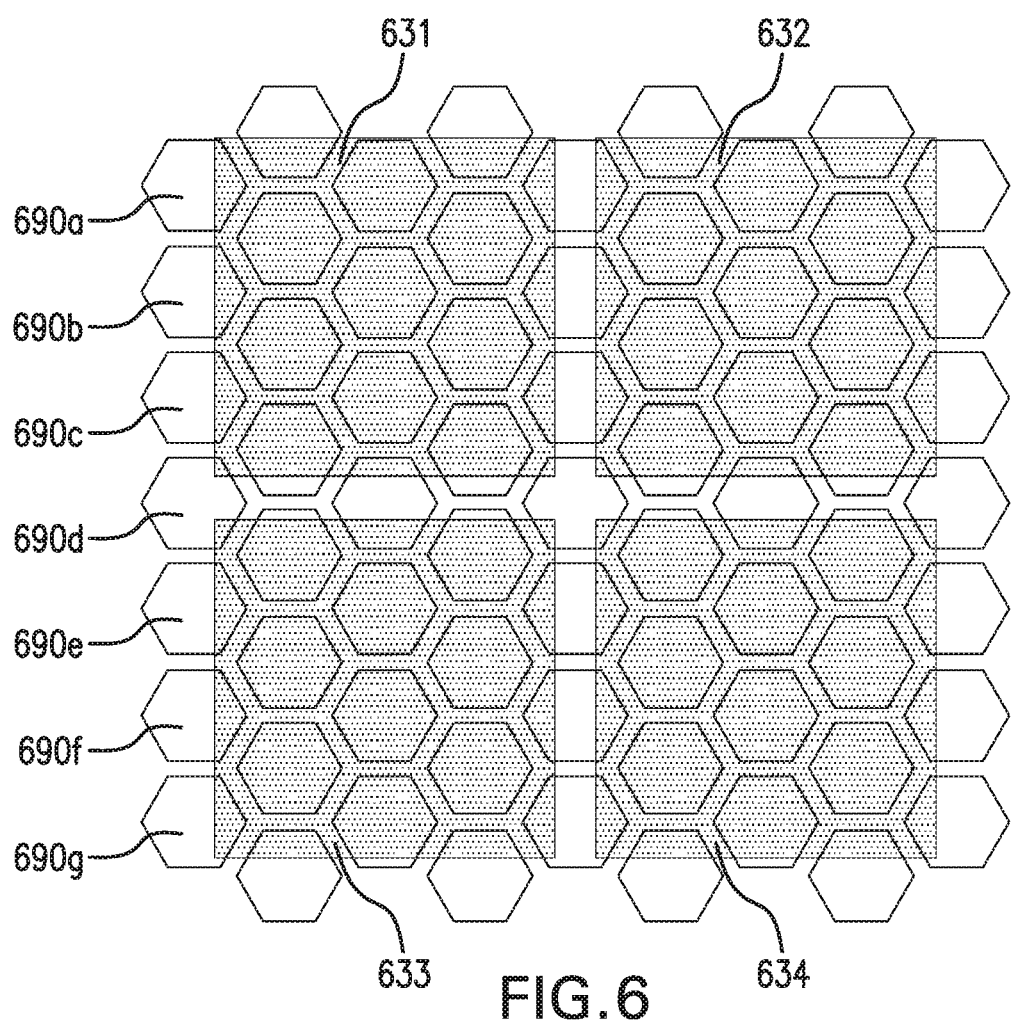
FIG. 6 is a top view of another embodiment of the two-dimensional array of micro-mesh grid electrodes using hexagonal/honeycomb geometry over a multi-pixel substrate according to the present disclosure.

FIG. 6 is a top view of another embodiment of the two-dimensional array of micro-mesh grid electrodes using hexagonal/honeycomb geometry over a multi-pixel substrate according to the present disclosure. As shown in FIG. 6, pixels 631-634 form the multi-pixel substrate, with a plurality of wells 690a, 690b, 690c, 690d . . . , with micro-mesh grid electrodes inside the dielectric layer. Comparison of FIG. 4 to FIG. 6 shows that the present disclosure allows some wells to be shared by many, i.e., at least two, pixel electrodes; that each well is not restricted by the shape of the pixel electrode and can extend across pixel boundaries; and also that wells can be formed from micro-mesh grid electrodes, in a honeycomb shape.

FIGS. 7(a)-7(d) illustrate fabrication of a multi-well structure with two grid electrodes according to an embodiment of the present disclosure. The multi-well structure of FIGS. 7(a)-7(d) was fabricated over glass substrates by:
   depositing the pixel electrode 230 on the substrate 260 via Aluminum sputtering;
   patterning the pixel electrode 230 using contact photolithography;
   depositing the first dielectric layer 241 via spin-casting polyimide;
   curing the polyimide;
   depositing the first conductive grid electrode layer 251 on the first dielectric layer 241 via Tungsten sputtering;
   depositing the second dielectric layer 242 on the first conductive grid electrode layer 251 via sputtering Tungsten;
   depositing the third dielectric layer 243 on the second conductive grid electrode layer 252 via spin-casting polyimide;
   curing the polyimide;
   depositing the etch mask layer 280 on the third dielectric layer 243 via sputtering Cr;
   patterning the etch mask layer 280 using contact photolithography;
   Cr etching using an RIE system; and
   etching the well until the pixel electrode is reached.

The etching of the well until the pixel electrode is preferably performed by: anisotropically etching the third dielectric layer 243 using oxygen plasma (O2 plasma) inside an ICP deep RIE system;
   etching the second conductive grid electrode layer 252 via dry etching of W with SF6 plasma;
   anisotropically etching the second dielectric layer using O2 plasma inside an ICP deep RIE system;
   etching the first conductive grid electrode layer via dry etching of W with SFG plasma; and
   anisotropically etching the first dielectric layer 241 using O2 plasma inside an ICP deep RIE system.

Figure 7A:
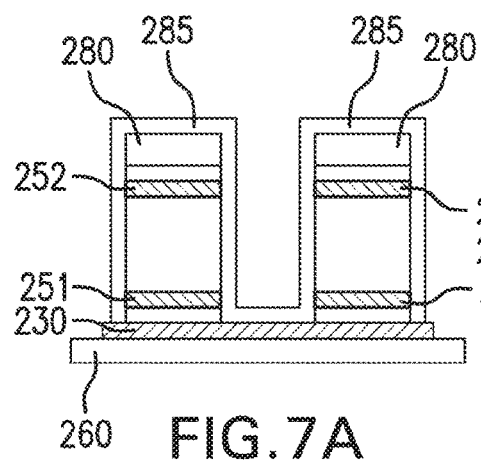
FIGS. 7(a)-7(d) illustrate fabrication of a multi-well structure with two grid electrodes according to an embodiment of the present disclosure.
Figure 7B:
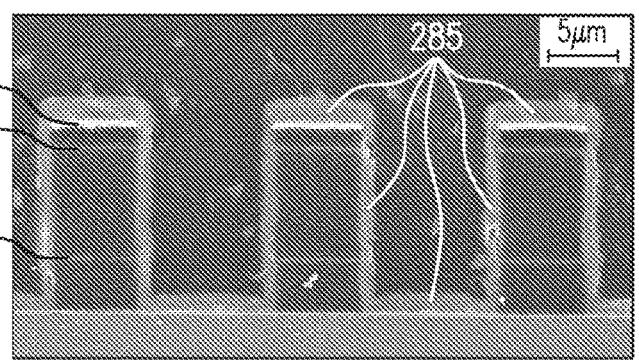

After etching the wells, SiO2 is conformally deposited using a TEOS-PECVD system, with FIG. 7(a) showing an ideal structure after etching the well, encapsulating the pillars and wells conformally with an oxide dielectric layer. FIG. 7(b) is an SEM cross-section showing the structure fabricated using the process described herein. FIG. 7(b) and FIG. 7(d) correspond to the steps illustrated in FIG. 2(j) and FIG. 2(l), respectively.

Figure 7C:
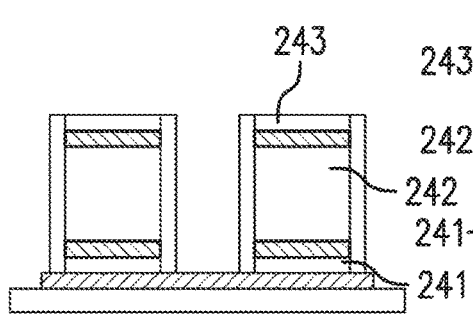
Figure 7D:
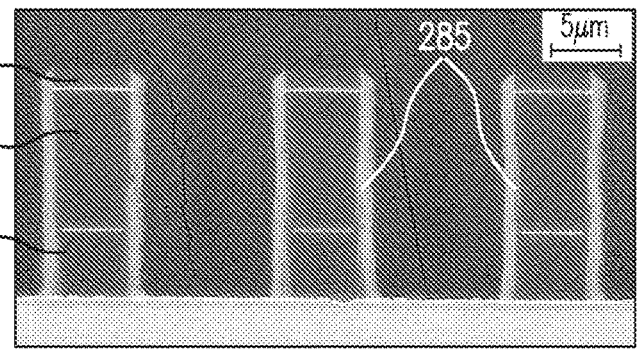

As shown in FIG. 7(c), the anisotropic etching of the oxide dielectric layer removes only the oxide from the bottom of the wells and top of the mask, without etching the oxide at the sidewalls. Leaving the oxide on the sidewalls ensures complete encapsulation of the grid electrodes by dielectric layers on all sides. The anisotropic etch of SiO2 is preferably performed using fluorinated anisotropic etching, with each dry etch sequence followed by a secondary plasma deposition that furnishes a very thin flour-carbon polymer passivation on the sidewalls.

The Cr mask is preferably etched using wet etching. FIG. 7(d) is an SEM cross-section showing preferred anisotropic oxide etching where the SiO2 remained intact, without etching the sidewalls.

As shown in FIG. 7(b) and FIG. 7(d), the anisotropic, i.e., vertical, removal of oxides at the bottom of well 290 and at the top of the mask, with the oxide on the sidewalls of the pillars not being etched, allows for complete encapsulation of the grid electrodes inside the dielectric layers.

Provided is a nanopattern, multi-well, solid-state a-Se radiation detector that includes a semiconductor, a pixel electrode, at least three dielectric layers, and at least two conductive grid electrode layers. The pixel electrode is deposited adjacent to the substrate and a first conductive grid electrode layer of the at least two conductive grid electrode layers is deposited on a first dielectric layer of the at least three dielectric layers. A second dielectric layer of the at least three dielectric layers is deposited on the first conductive grid electrode layer. A second conductive grid electrode layer of the at least two conductive grid electrode layers is deposited on the second dielectric layer. A third dielectric layer of the at least three dielectric layers is deposited on the second conductive grid electrode layer, and an etch mask is deposited on the third dielectric layer. A first etching forms at least two pillars with at least one well therebetween, an oxide dielectric layer is deposited on the at least two pillars and on a bottom of the at least one well, and a second etching removes the oxide dielectric layer from the bottom of the at least one well. More than two conductive grid electrode layers may also be utilized. If, e.g., three conductive grid electrode layers are utilized, a third dielectric layer is formed on the second conductive grid electrode layer, a third conductive grid electrode layer is formed on the third dielectric layer, and a fourth dielectric layer is formed on the third conductive grid electrode layer, thereby forming an n+1 dielectric layer on an nth conductive grid electrode layer, with the etch mask being deposited on the n+1 dielectric layer. The first etching is then performed to form at least two pillars with at least one well therebetween, as described above.

The apparatus provided by the present disclosure provides a UTD charge sensing, which enables operating the detector at its theoretical limit of charge diffusion, improves in an avalanche-mode by more than three orders-of-magnitude.

While the invention has been shown and described with reference to certain aspects thereof, it will be understood by those skilled in the art that various changes in form and details may be made therein without departing from the spirit and scope of the present invention as defined by the appended claims and equivalents thereof.

REFERENCES

[1] J. A. Rowlands and S. Kasap; Amorphous Semiconductors Usher in Digital X-Ray Imaging. Phys. Today, 50(10: 24-30, 1997.

[2] N. F. Mott; Conduction in non-crystalline systems. VII. Non-ohmic behavior and switching. Phil. Mag., 24(190): 911-934, 1971.

[3] G. Juska and K. Arlauskas; Impact ionization and mobilities of charge carriers at high electric fields in amorphous selenium. Phys. Stat. Sol. (a), 59(1): 389-393, 1980.

[4] M. M. Wronski and J. A. Rowlands; Direct-conversion flat-panel imager with avalanche gain: Feasibility investigation for HARP-AMFPI. Medical Physics, 35(12): 5207-5218, 2008.

[5] M. M. Wronski, W. Zhao, A. Reznik, G. DeCrescenzo, K. Tanioka, and J. A. Rowlands; A solid-state amorphous selenium avalanche technology for low photon flux imaging applications. Med. Phys., 37(9): 4982, 2010.

[6] G. Juska, K. Arlauskas, J. Kocka, M. Hoheisel, and P. Chabloz; Hot Electrons in Amorphous Silicon. Physical Review Letters, 75: 2984-2987, 1995.

[7] K. Tanioka; The ultrasensitive TV pickup tube from conception to recent development. J. Mater. Sci.: Mater. Electron., 18(0): 321-325, 2007.

[8] U.S. Pat. No. 6,437,339 to Lee, et al., the content of which is incorporated herein by reference.

[9] D. L. Y. Lee; Selenium detector with a grid for selenium charge gain. Proceedings of SPIE, 5745: 216-222, 2005.

[10] D. C. Hunt, K. Tanioka, and J. A. Rowlands. X-ray imaging using avalanche multiplication in amorphous selenium: Investigation of depth dependent avalanche noise. Med, Phys., 34(3): 976-986, 2007.

[11] U.S. Pat. No. 8,129,688 to A. H. Goldan, et al., the content of which is incorporated herein by reference.

[12] A. H. Goldan, O. Tousignant, K. S. Karim, and J. A. Rowlands; Unipolar time-differential pulse response with a solid-state Charpak photoconductor. Appl. Phys. Lett., 101 (21): 213503, 2012.

[13] A. H. Goldan, J. A. Rowlands, O. Tousignant, and K. S. Karim; Unipolar time-differential charge sensing in non-dispersive amorphous solids. J. Appl. Phys., 113(22): 224502, 2013.

[14] F. Sauli; GEM: A new concept for electron amplification in gas detectors. Nucl. Instr. and Meth. A, 386(2-3): 531-534, 1997.

[15] U.S. Pat. Publ. No. 2016/0087113 A1 of U.S. application Ser. No. 14/888,879 to A. H. Goldan, et al., the content of which is incorporated herein by reference.

[16] U.S. Pat. Publ. No. 2015/0171232 A1 of U.S. application Ser. No. 14/414,607 to A. H. Goldan, et al., the content of which is incorporated herein by reference.

[17] A. H. Goldan, J. A. Rowlands, M. Lu, and W. Zhao; Nanopattern multi-well avalanche selenium detector with picosecond time resolution. In Proc. Conf. Rec. IEEE NSS/MIC, pages N32-4, Seattle, 2014.

What is claimed is:

1. A nanopattern, multi-well, solid-state a-Se radiation detector comprising:
    a semiconductor;
    a pixel electrode;
    at least three dielectric layers; and
    at least two conductive grid electrode layers,
    wherein the pixel electrode is deposited adjacent to a substrate,
    wherein a first conductive grid electrode layer of the at least two conductive grid electrode layers is deposited on a first dielectric layer of the at least three dielectric layers,
    wherein a second dielectric layer of the at least three dielectric layers is deposited on the first conductive grid electrode layer,
    wherein a second conductive grid electrode layer of the at least two conductive grid electrode layers is deposited on the second dielectric layer,
    wherein a third dielectric layer of the at least three dielectric layers is deposited on the second conductive grid electrode layer,
    wherein an etch mask is deposited on the third dielectric layer,
    wherein a first etching forms at least two pillars with at least one well therebetween,
    wherein an oxide dielectric layer is deposited on the at least two pillars and on a bottom of the at least one well, and
    wherein a second etching removes the oxide dielectric layer from the bottom of the at least one well.

2. The detector of claim 1, wherein the first etching is performed from the third dielectric layer, to the second conductive grid electrode layer, to the second dielectric layer, to the first conductive grid electrode layer, to the first dielectric layer, and to the pixel electrode, and
    wherein the first etching does not etch the pixel electrode.

3. The detector of claim 1, wherein the second etching does not remove the oxide dielectric layer from sides of the at least two pillars with the at least one well, and
    wherein the second etching does not etch the pixel electrode.

4. The detector of claim 1, wherein each of the at least two pillars includes the first conductive grid electrode layer and the second conductive grid electrode layer, forming on opposite sides of the at least one well a pair of first conductive grid electrode layers and a pair of second conductive grid electrode layers.

5. The detector of claim 4,
    wherein the pair of first conductive grid electrode layers are spaced apart from the pixel electrode by a first distance,
    wherein the pair of second conductive grid electrode layers are spaced apart from the pixel electrode by a second distance, and
    wherein the first distance is different from the second distance.

6. The detector of claim 4, wherein the oxide dielectric layer fully encapsulates each of the pair of first conductive grid electrode layers.

7. The detector of claim 4, wherein the oxide dielectric layer fully encapsulates each of the pair of second conductive grid electrode layers.

8. The detector of claim 4, wherein the pair of first conductive grid electrode layers align with the pair of second conductive grid electrode layers, without aligning the first conductive grid electrode layer and the second conductive grid electrode layer before performing the first etching.

9. The detector of claim 1, wherein the first conductive grid electrode layer and the second conductive grid electrode layer are not patterned before stacking on the first dielectric layer or on the second dielectric layer, respectively.

* * * * *